(12) United States Patent
Vettori

(10) Patent No.: US 11,402,428 B2
(45) Date of Patent: Aug. 2, 2022

(54) HIGH-PERFORMANCE PROBE CARD IN HIGH-FREQUENCY

(71) Applicant: Technoprobe S.p.A., Cernusco Lombardone (IT)

(72) Inventor: Riccardo Vettori, Cernusco Lombardone (IT)

(73) Assignee: Technoprobe S.p.A., Cernusco Lombardone (IT)

( * ) Notice: Subject to any disclaimer, the term of this patent is extended or adjusted under 35 U.S.C. 154(b) by 0 days.

(21) Appl. No.: 17/098,179

(22) Filed: Nov. 13, 2020

(65) Prior Publication Data

US 2021/0063478 A1 Mar. 4, 2021

Related U.S. Application Data

(63) Continuation-in-part of application No. PCT/EP2019/062276, filed on May 14, 2019.

(30) Foreign Application Priority Data

May 16, 2018 (IT) .................. 102018000005444

(51) Int. Cl.
*G01R 31/28* (2006.01)
*G01R 1/067* (2006.01)
(52) U.S. Cl.
CPC ..... *G01R 31/2889* (2013.01); *G01R 1/06716* (2013.01); *G01R 1/06772* (2013.01)

(58) Field of Classification Search
CPC ............ G01R 31/2889; G01R 1/06716; G01R 1/06772
See application file for complete search history.

(56) References Cited

U.S. PATENT DOCUMENTS

| | | | |
|---|---|---|---|
| 4,906,920 A | 3/1990 | Huff et al. | |
| 2003/0137315 A1 | 7/2003 | Degani et al. | |
| 2009/0130785 A1 | 5/2009 | Matsumoto et al. | |
| 2018/0059138 A1* | 3/2018 | Atwood | G01R 31/2889 |
| 2019/0187205 A1* | 6/2019 | Nagata | G01R 31/2886 |

FOREIGN PATENT DOCUMENTS

EP 0 294 939 A2 12/1988

\* cited by examiner

*Primary Examiner* — Paresh Patel
(74) *Attorney, Agent, or Firm* — Seed Intellectual Property Law Group LLP

(57) ABSTRACT

A probe card for a test equipment of electronic devices includes a flexible membrane configured to carry high frequency signals between a device under test and a support plate. The flexible membrane is connected to the support plate through a peripheral zone, and a damping structure is arranged between the support plate and the flexible membrane. A plurality of micro contact probes include a body extending between a first end and a second end, and the second end is configured to abut onto contact pads of the device under test, and the damping structure and the first ends of the micro contact probes are in contact with opposite faces of a same contact zone of the flexible membrane. The flexible membrane includes at least one weakening zone arranged between the contact zone and the peripheral zone.

19 Claims, 6 Drawing Sheets

HIGH-PERFORMANCE PROBE CARD IN HIGH-FREQUENCY

BACKGROUND

Technical Field

The present disclosure relates to a probe card for testing electronic devices that are integrated on a semiconductor wafer, and the following description is made with reference to this application field with the only purpose of simplifying the exposition.

Description of the Related Art

As it is well known, essentially a probe card is a device adapted to electrically connect a plurality of contact pads of a microstructure, in particular an electronic device that is integrated on a semiconductor wafer, with corresponding channels of a test equipment that performs the functionality testing thereof, in particular electric, or generically the test.

The test, which is performed on integrated devices, is particularly useful for detecting and isolating defective circuits as early as in the production phase. Normally, probe cards are therefore used for the electric test of circuits that are integrated on wafers before cutting and assembling them inside a chip containment package.

A probe card comprises a testing head, which essentially includes in turn a plurality of movable contact probes retained by at least one pair of supports or guides that are substantially plate-shaped and parallel to each other. These plate-shaped supports are provided with suitable holes and are arranged at a certain distance from each other in order to leave a free space or air gap for the movement and possible deformation of the contact probes, which are usually made of wires of special alloys with good electric and mechanical properties.

By way of example, FIG. 1 schematically illustrates a known probe card, wholly indicated with reference number 15 and including a testing head 1 in turn comprising at least one plate-shaped support or upper guide 2 and one plate-shaped support or lower guide 3 having respective guide holes 4 and 5 within which a plurality of contact probes 6 slides.

Each contact probe 6 ends at an end with a contact tip 7 intended to abut onto a contact pad 8 of a device under test that is integrated on a wafer 9, so as to realize the mechanical and electric contact between this device under test and a test equipment (not shown), said probe card being a terminal element of this test equipment.

As indicated in FIG. 1, the upper guide 2 and the lower guide 3 are suitably spaced by an air gap 10 that allows the deformation of the contact probes 6.

The proper connection between the contact probes 6 and the contact pads 8 of the device under test is ensured by the pressure of the testing head 1 on the device itself, the contact probes 6, movable within the guide holes 4 and 5 formed in the guides 2 and 3, undergoing, during said pressing contact, a bending inside the air gap 10 and a sliding inside said guide holes. Testing heads of this type are commonly called "vertical probe heads."

In some cases, the contact probes are fixedly fastened to the head itself at the upper plate-shaped support: such testing heads are referred to as "blocked probe testing heads."

However, more frequently, testing heads are used with not fixedly fastened blocked probes, but interfaced to a so-called board, possibly through a microcontact board: such testing heads are referred to as unblocked testing heads. The microcontact board is usually called "space transformer" since, besides contacting the probes, it also allows spatially redistributing the contact pads realized thereon with respect to the contact pads on the device under test, in particular relaxing the distance constraints between the centers of the pads themselves.

In this case, still referring to FIG. 1, each contact probe 6 has a further end zone or region ending with a so-called contact head 11 towards a contact pad 12 of a plurality of contact pads of a space transformer 13 of the probe card 15 comprising the testing head 1. The proper electric connection between contact probes 6 and space transformer 13 is ensured by the pressing abutment of the contact heads 11 of the contact probes 6 onto the contact pads 12 of said space transformer 13 analogously to the contact between the contact tips 7 with the contact pads 8 of the device under test that is integrated on the wafer 9.

Furthermore, the probe card 15 comprises a support plate 14, generally a printed circuit board (PCB), connected to the space transformer 13, by means of which the probe card 15 interfaces with the test equipment.

The correct operation of a probe card is basically linked to two parameters: the vertical movement, or overtravel, of the contact probes and the horizontal movement, or scrub, of the contact tips of such contact probes on the contact pads.

All these features should be evaluated and calibrated in the manufacturing step of a probe card, since the proper electric connection between probes and device under test should always be ensured.

Likewise, it is important to ensure that the pressing contact of the contact tips of the probes onto the contact pads of the device under test be not so high as to cause the breakage of the probe or the pad itself.

This problem is strongly felt in the case of the so-called short probes, namely probes with limited body length, in particular with dimensions less than 5000 µm. Probes of this type are for instance used for high-frequency applications, the reduced length of the probes limiting the connected self-inductance phenomenon. In particular, the term "probes for high-frequency applications" indicates probes that are capable of carrying signals with frequencies higher than 1 GHz.

In fact, there is the recently felt need of producing probe cards capable of carrying signals at ever higher frequencies up to the radiofrequencies, with a consequent drastic reduction in length of the contact probes, so as to enable these signals to be carried without adding noise thereto, for example due to the above-mentioned self-inductance phenomenon.

However, in this case, the reduced length of the body of the probes dramatically increases the rigidity of the probe itself, which leads to an increase in the force applied by the respective contact tip onto the contact pads of a device under test, which can lead to the breakage of those pads, with irreparable damage to the device under test, a situation that has to be obviously avoided. Even more dangerously, the increase in the rigidity of the contact probe due to the reduction in the length of its body also increases the risk of breakage of the probes themselves.

Solutions in which short probes are associated with a flexible membrane connected to a PCB are known, conductive tracks for carrying high-frequency signals from the probes towards the PCB being formed in said flexible membrane. In this type of probe cards, during the test step, the flexible membrane is subjected to considerable tensile stresses, which can lead to excessive deformation and damage thereof. US 2018/0059138 A1 and EP 0 294 939 A2 disclose probe cards provided with flexible membranes connected to micro-contact probes.

Therefore, it is desirable to provide a probe card having structural and functional features such as to allow overcoming the limitations and drawbacks still affecting the prior art probe cards, in particular capable of effectively carrying high-frequency signals, meanwhile ensuring an excellent mechanical operation when contacting the pads of a device under test.

BRIEF SUMMARY

The present disclosure provides a probe card in which the contact with a device under test is performed by probes of reduced dimensions or micro probes connected to a contact zone of a flexible membrane, which comprises, in a zone thereof that is adjacent to the contact zone, mechanical-weakening elements which facilitate the local deformation of said adjacent zone and reduce the stresses which the flexible membrane is subjected to during the contact with the device under test.

More in particular, an exemplary probe card for a test equipment of electronic devices comprises a support plate, a flexible membrane adapted to carry high-frequency signals between a device under test and the support plate, the flexible membrane being connected to the support plate through a peripheral zone thereof, a damping structure arranged between the support plate and the flexible membrane and adapted to dampen the contact with the device under test, as well as a plurality of micro contact probes comprising a body extending between a first end and a second end, said second end being adapted to abut onto contact pads of the device under test, wherein the damping structure and the first ends of the micro contact probes are in contact with opposite faces of a same contact zone of the flexible membrane, characterized in that the flexible membrane includes at least one weakening zone arranged between the contact zone and the peripheral zone adjacent thereto, the weakening zone comprising at least one weakening element adapted to mechanically weakening the flexible membrane and to locally increase the deformability thereof.

More particularly, the disclosure comprises the following additional and optional features, taken singularly or in combination if necessary or desired.

According to an aspect of the present disclosure, the weakening element may be in the form of a plurality of cuts extending parallel to one another along a longitudinal axis of the flexible membrane. In particular, the extension of the cuts along the longitudinal axis may be substantially between 1 mm and 4 mm.

Alternatively, the weakening element may be in the form of at least one lowered portion of the flexible membrane in the weakening zone.

According to an aspect of the present disclosure, the flexible membrane may comprise two weakening zones which are symmetrically arranged with respect to the contact zone.

According to an aspect of the present disclosure, the contact zone may comprise at least one further weakening element close to at least one micro contact probe.

According to another aspect of the present disclosure, the probe card may comprise at least one support including a plurality of guide holes adapted to house the micro contact probes, said support being adapted to support the micro contact probes and the flexible membrane.

According to another aspect of the present disclosure, the micro contact probes may be substantially T-shaped, wherein the first end thereof has a diameter larger than the diameter of the body so as to define a surface abutting onto the support.

According to an aspect of the present disclosure, the micro contact probes may be connected to the flexible membrane by means of an engagement element at the first end thereof, the engagement element being configured so as to allow an interlocking connection between the micro contact probes and the flexible membrane and comprising a first portion and a second portion projecting from the top of the first end and separated by a space, said portions being adapted to be inserted into an opening of the flexible membrane and to be moved one towards the other by the walls of said opening.

Furthermore, the support plate may be a printed circuit board.

According to another aspect of the present disclosure, the flexible membrane may comprise a plurality of conductive tracks extending from the contact zone towards the support plate passing through the weakening zone.

Still according to another aspect of the present disclosure, the damping structure may be a testing head housing a plurality of contact elements extending between a first end and a second end.

Still according to another aspect of the present disclosure, the second end of each contact element of the testing head may abut onto a same point which contacts the first end of a respective micro contact probe.

Still according to another aspect of the present disclosure, the contact elements of the testing head may comprise a group of contact elements adapted to carry power signals and/or ground signals and/or low frequency signals between the device under test and the support plate, said contact elements of said group being electrically connected to the micro contact probes.

Still according to another aspect of the present disclosure, the contact zone may comprise through-holes between the first face and the second face for the passage of at least one contact element adapted to carry power signals and/or ground signals and/or low frequency signals between the device under test and the support plate.

Finally, the flexible membrane may comprise a conductive portion arranged at an abutment point of the contact elements onto the first face and/or arranged at a contact point of the micro contact probes with the second face.

The features and advantages of the probe card according to the disclosure will become apparent from the following description of an embodiment thereof, given by way of non-limiting example with reference to the accompanying drawings.

DETAILED DESCRIPTION

Figure 1:
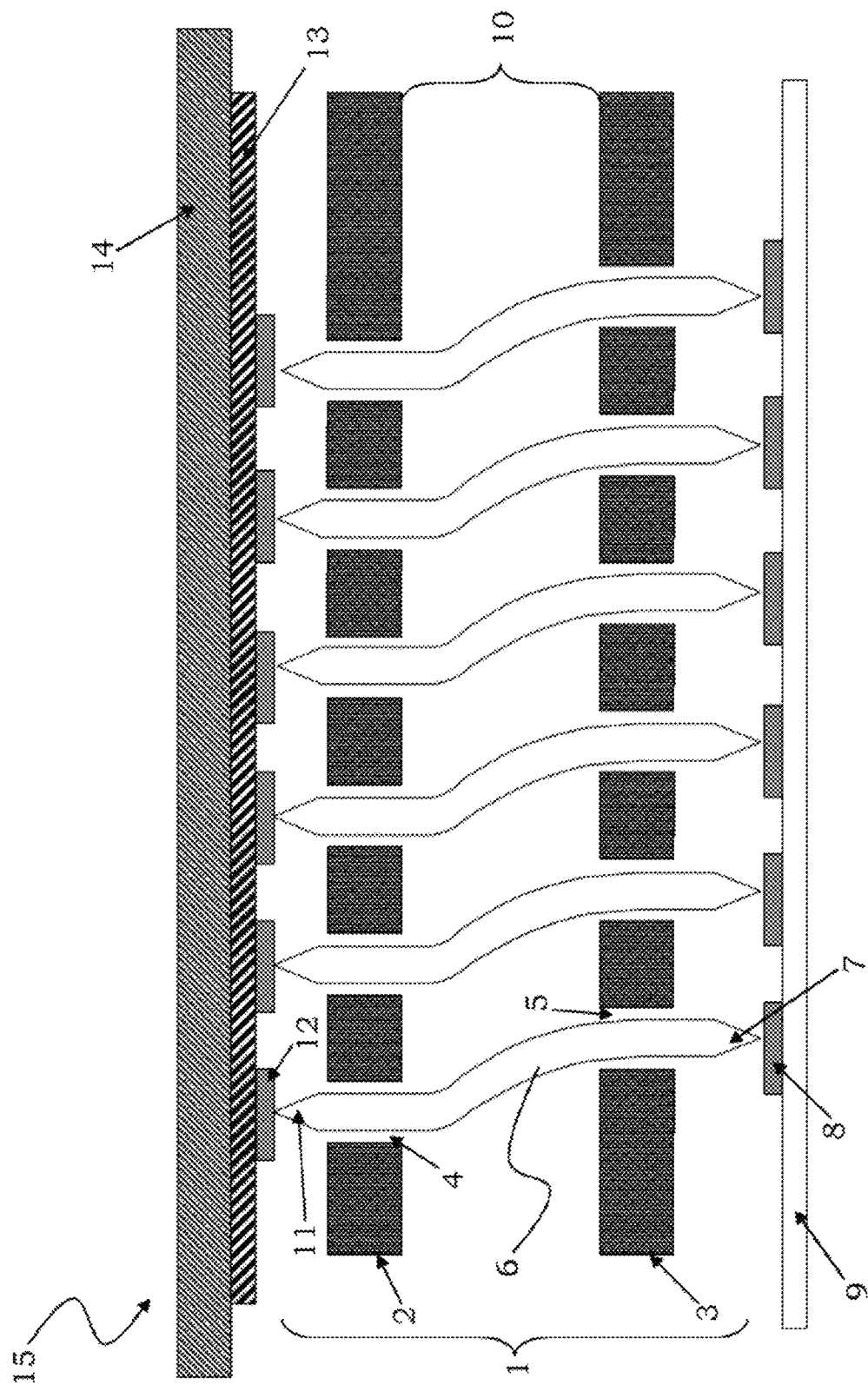
FIG. 1 schematically shows a probe card according to the prior art.
Figure 2:
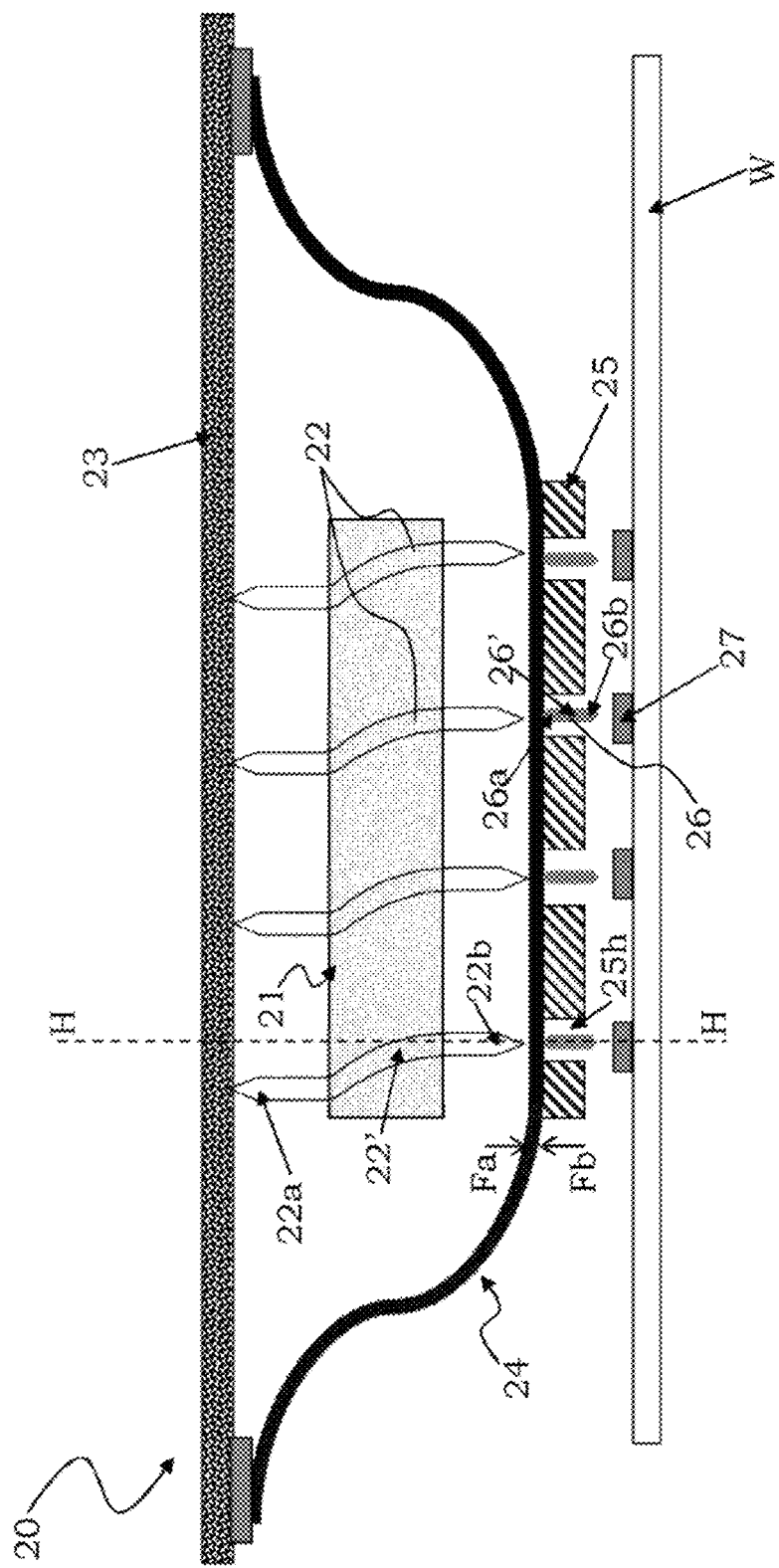
FIG. 2 schematically shows a probe card according to the present disclosure.

Referring to those figures, and in particular to FIG. 2, a probe card according to the present disclosure is globally and schematically indicated with reference number 20.

It is worth noting that the figures represent schematic views and are not drawn to scale, but instead they are drawn so as to emphasize the important features of the disclosure. Moreover, in the figures, the different elements are depicted in a schematic manner, their shape varying depending on the application desired. It is also noted that in the figures the same reference numbers refer to elements that are identical in shape or function. Finally, particular features described in relation to an embodiment illustrated in a figure are also applicable to other embodiments illustrated in the other figures.

In its more general form, the probe card 20 is adapted to connect with a test equipment (not shown in the figures) for testing electronic devices that are integrated on a semiconductor wafer, in particular high frequency devices, i.e., devices adapted to carry high frequency signals, in particular greater than 1 GHz.

The probe card 20 comprises a damping structure 21, which is adapted to deaden and dampen the contact of said probe card 20 with a device under test.

According to a preferred embodiment of the present disclosure, the damping structure 21 is a testing head, still indicated with reference number 21, which houses a plurality of contact elements 22, four of said contact elements 22 being shown in FIG. 2 just by way of example.

The probe card 20 further comprises a support plate 23, which is preferably a printed circuit board (PCB) that ensures the connection between said probe card 20 and the test equipment.

The contact elements 22 comprise a body 22' extending along a longitudinal axis H-H between a first end portion 22a and a second end portion 22b, the first end portion 22a being adapted to abut onto the support plate 23.

The probe card 20 further comprises a flexible membrane 24, which has a first face Fa, onto which the second end portion 22b of the contact elements 22 is adapted to abut, and a second face Fb, opposite the first face Fa. Still according to the local reference system of FIG. 2, the first face Fa of the flexible membrane 24 is an upper face, namely a face facing towards the testing head 21, whereas the second face Fb of the flexible membrane 24 is a lower face, namely a face facing towards the device under test. The testing head 21 is thus suitably arranged between the flexible membrane 24, in particular the first face Fa thereof, and the support plate 23.

As it will be illustrated hereinafter in greater detail, the flexible membrane 24 is adapted to carry high frequency signals between the device under test and the support plate 23.

Furthermore, the probe card 20 comprises a support 25, which is provided with a plurality of guide holes 25h adapted to house a corresponding plurality of micro contact probes 26 adapted to contact pads 27 of a device under test that is integrated on a semiconductor wafer W, the flexible membrane 24 being arranged between the contact elements 22 and said micro contact probes 26.

The micro contact probes 26 comprise a body 26', also extending along the longitudinal axis H-H between a first end 26a and a second end 26b, the first end 26a being adapted to contact the flexible membrane 24 and the second end 26b being adapted to contact the contact pads 27 of the device under test that is integrated on the semiconductor wafer W, as above indicated.

The support 25 is adapted to support both the flexible membrane 24 and the micro contact probes 26.

Figure 3:
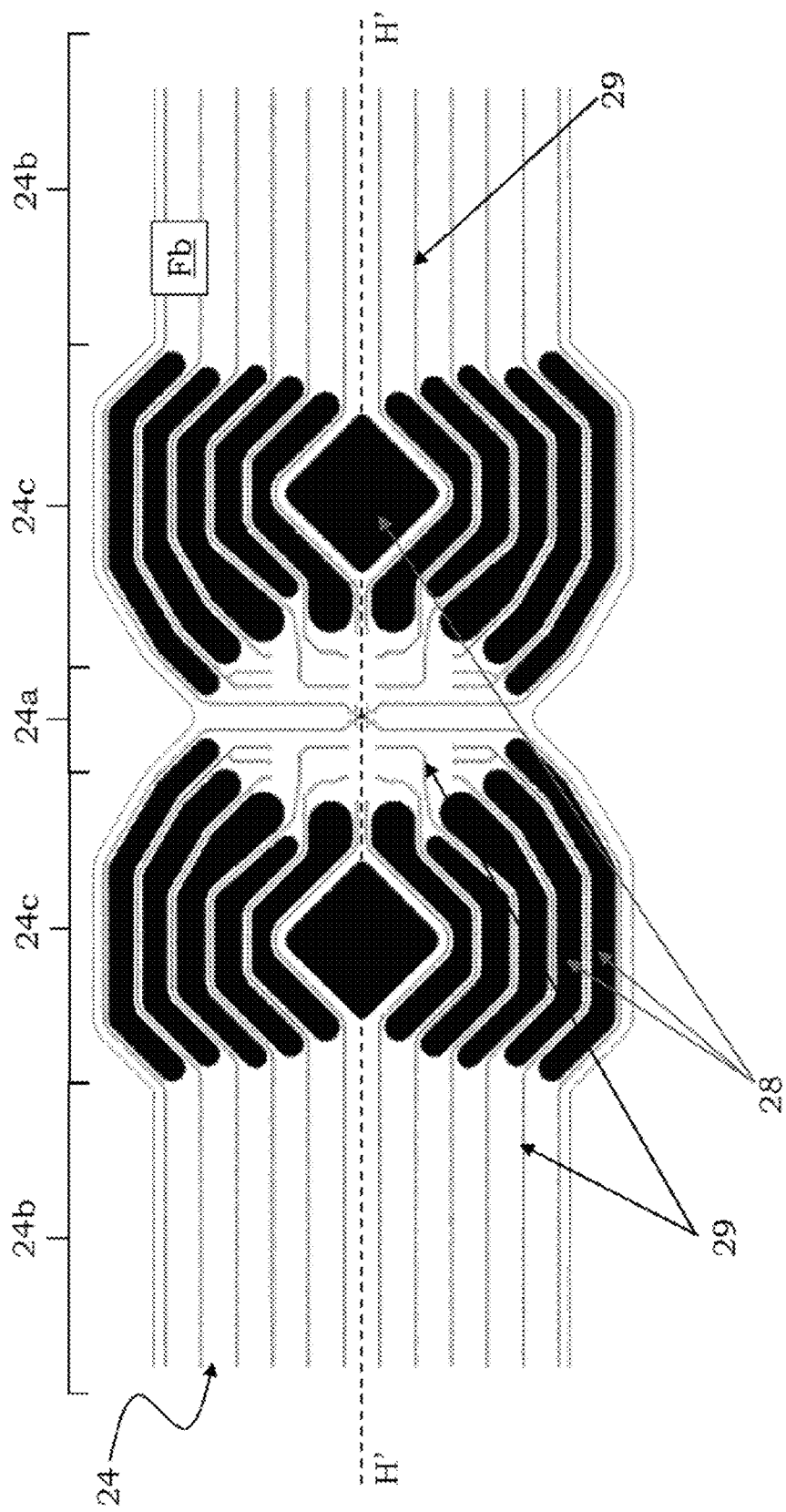
FIG. 3 schematically shows a top view of a flexible membrane of the probe card according to the present disclosure.

Now referring to FIG. 3, the flexible membrane 24 comprises a first zone or contact zone 24a and a second zone or peripheral zone 24b, wherein the contact zone 24a is adapted to contact the testing head 21 and the device under test, whereas the peripheral zone 24b is adapted to connect to the support plate 23. Preferably, the contact zone 24a is a central zone of the flexible membrane 24 and is surrounded by the peripheral zone 24b.

Generally, the area of the contact zone 24a substantially corresponds to the area of the semiconductor wafer W comprising the device or devices under test, and the corresponding arrangement of the micro contact probes 26 in contact with said contact zone 24a substantially corresponds to the corresponding arrangement of the contact pads 27.

The second ends 22b of the contact elements 22 abut onto the first face Fa of the flexible membrane 24 at the contact zone 24a, whereas the first ends 26a of the micro contact probes 26 are in contact with the second face Fb, still at said contact zone 24a. In particular, the second end 22b of each contact element 22 abuts onto a same point (seen along a longitudinal axis H'-H' of the flexible membrane 24) which contacts the first end 26a of a respective micro contact probe 26.

In other words, a respective contact element 22 abutting at the same position, but on an opposite face, of the flexible membrane 24 corresponds to a micro contact probe 26, said contact element 22 acting as a damping element for the micro contact probe 26.

Although the embodiment above exposed is to be considered the preferred one, it is possible to also provide other configurations. By way of example, the contact elements 22 may be in a different number from the micro contact probes 26 and may also be arranged so as to abut onto points different from the micro contact probes 26.

In any case, during the contact with the device under test, the problem of rigidity of the micro contact probes 26 is solved by the damping performed by the contact elements 22 associated therewith. During the contact of the micro contact probes 26 with the device under test, the contact elements 22 thus act as damping elements, adjusting the contact force on the contact pads 27 of said device under test.

It is noted that the contact elements 22 of the testing head 21 have a length generally between 1.5 mm and 10 mm, i.e., a length much greater than that of the micro contact probes 26 which, as previously seen, is less than 500 μm, and therefore they have a much greater bending capacity, such as to ensure the aforementioned damping effect of said contact elements 22. Suitably, the contact elements 22 are made of materials suitable to maximize the damping effect for the micro contact probes 26.

Still referring to FIG. 3, advantageously according to the present disclosure, the flexible membrane 24 includes at least one intermediate zone or weakening zone 24c adjacent to the contact zone 24a and to the peripheral zone 24b, said weakening zone 24c being a zone of the flexible membrane 24 having a reduced-mechanical resistance. As noted in FIG. 3, the weakening zone 24c is arranged between the central zone 24a and the peripheral zone 24b.

The flexible membrane 24 preferably comprises two weakening zones 24c symmetrically arranged with respect to the contact zone 24a and adjacent thereto, and as a result it also comprises two peripheral zones 24b.

Alternatively, the flexible membrane 24 is substantially circular-shaped, whereas the peripheral zone 24b and the weakening zone 24c are substantially ring-shaped and are arranged concentrically around the contact zone 24a. Obviously the shape of the membrane and of the zones thereof may be adapted to the circumstances and/or needs and are not limited to the examples herein illustrated.

Specifically, the weakening zone 24c comprises at least one weakening element 28 adapted to mechanically weaken the flexible membrane 24 and thus to increase its elastic deformation capacity.

The presence of the weakening zone 24c, including the weakening element 28, ensures that, during the contact of the probe card 20 with the device under test, the stresses which the flexible membrane 24 is subjected to, are absorbed by said weakening zone 24c. The weakening elements 28 of the weakening zone 24c are in fact adapted to mechanically weaken the flexible membrane 24 in said weakening zone 24c and to locally increase the deformability thereof, ensuring that the remaining zones of said flexible membrane 24 are not subjected to excessive stresses.

Specifically, during the contact with the device under test, the central zone 24a of the flexible membrane 24 tends to raise and thus the flexible membrane 24 in its whole is subjected to considerable tensile stresses, said flexible membrane being generally fixedly fastened in the testing head. Suitably according to the present disclosure, said tensile stresses are absorbed by the weakening zone 24c, which tends to deform more easily with respect to the rest of the flexible membrane 24 thanks to the presence of the weakening element 28.

In other words, the deformation of the weakening zone 24c caused by the presence of the weakening element 28 allows raising the flexible membrane 24 at the central zone 24a thereof, meanwhile preventing the movement and therefore the formation of tensile stresses in the rest of the extension thereof, in particular in the peripheral zone 24b.

In a preferred embodiment of the present disclosure, the weakening element 28 is in the form of a plurality of cuts, still indicated by reference number 28, extending substantially parallel to one another along the longitudinal axis H'-H' of the flexible membrane 24, as indicated in FIG. 3.

The extension of the cuts 28 along the longitudinal axis H'-H' is substantially between 1 mm and 4 mm, said extension being substantially the same as for all cuts 28 of the weakening zone 24c.

Alternatively, it is possible to realize cuts 28 having an extension different from one another, in particular cuts 28 having a smaller extension since they are arranged at a central portion of the weakening zone 24c. In this case, the corresponding lengths of the cuts 28 will be adapted to the particular layout adopted.

In any case, the cuts 28 form a plurality of arms in the flexible membrane 24.

Suitably, the cuts 28 are dimensioned and arranged in the weakening zone 24c so as to allow raising the contact zone 24a by at least 70 μm during the contact with the device under test, without excessive tensile stresses for the flexible membrane 24.

In an alternative embodiment of the present disclosure, the weakening element 28 is in the form of a lowered portion of the flexible membrane 24. In particular, in this alternative embodiment, it is possible to provide for the presence of a plurality of lowered portions (or non-through slots) which develop substantially parallel to one another along the longitudinal axis H'-H' of the flexible membrane 24, with equal or different extension; it is also possible to provide for the presence of only one lowered portion in the weakening zone 24c, possibly extending by the entire weakening zone 24c or by a portion thereof, in particular adapted to cover at least 70% of the area of said weakening zone 24a.

Still referring to FIG. 3, the flexible membrane 24 comprises a plurality of conductive tracks 29 extending from the contact zone 24a towards the peripheral zone 24b, and thus towards the support plate 23, passing through the weakening zone 24c. The conductive tracks 29 are thus electrically connected to the support plate 23, for instance through a pressing contact with contact pads of said support plate 23.

In the embodiment of FIG. 3, between two adjacent cuts 28 in the weakening zone 24c only one conductive track 29 passes, even if obviously other configurations may also be provided according to the requirements and/or needs. For instance, it is possible to define a portion of the weakening zone 24c without cuts 28 and dedicated to the passage of the conductive tracks 29.

The conductive tracks 29 extend along the second face Fb of the flexible membrane 24 from the contact point with the corresponding micro contact probe 26, said conductive tracks 29 may also extend on the first face Fa of the flexible membrane 24, if desired, or for example, if the configuration requires it.

Furthermore, the conductive tracks 29 may also extend within the flexible membrane 24 (namely they may be embedded therein). In this case, it is possible to realize a flexible membrane 24 wherein the conductive tracks 29 are made on different levels starting from the second face Fb. The number of levels of the flexible membrane 24 where the conductive tracks 29 are made may vary according to the needs and/or circumstances, in particular according to the number of signals to be carried and thus according to the complexity of the routing pattern to be made on said flexible membrane 24. By way of example, a configuration can be provided wherein a first level comprises tracks adapted to carry the power signal and a second level comprises tracks adapted to carry the ground signal.

Figure 4:
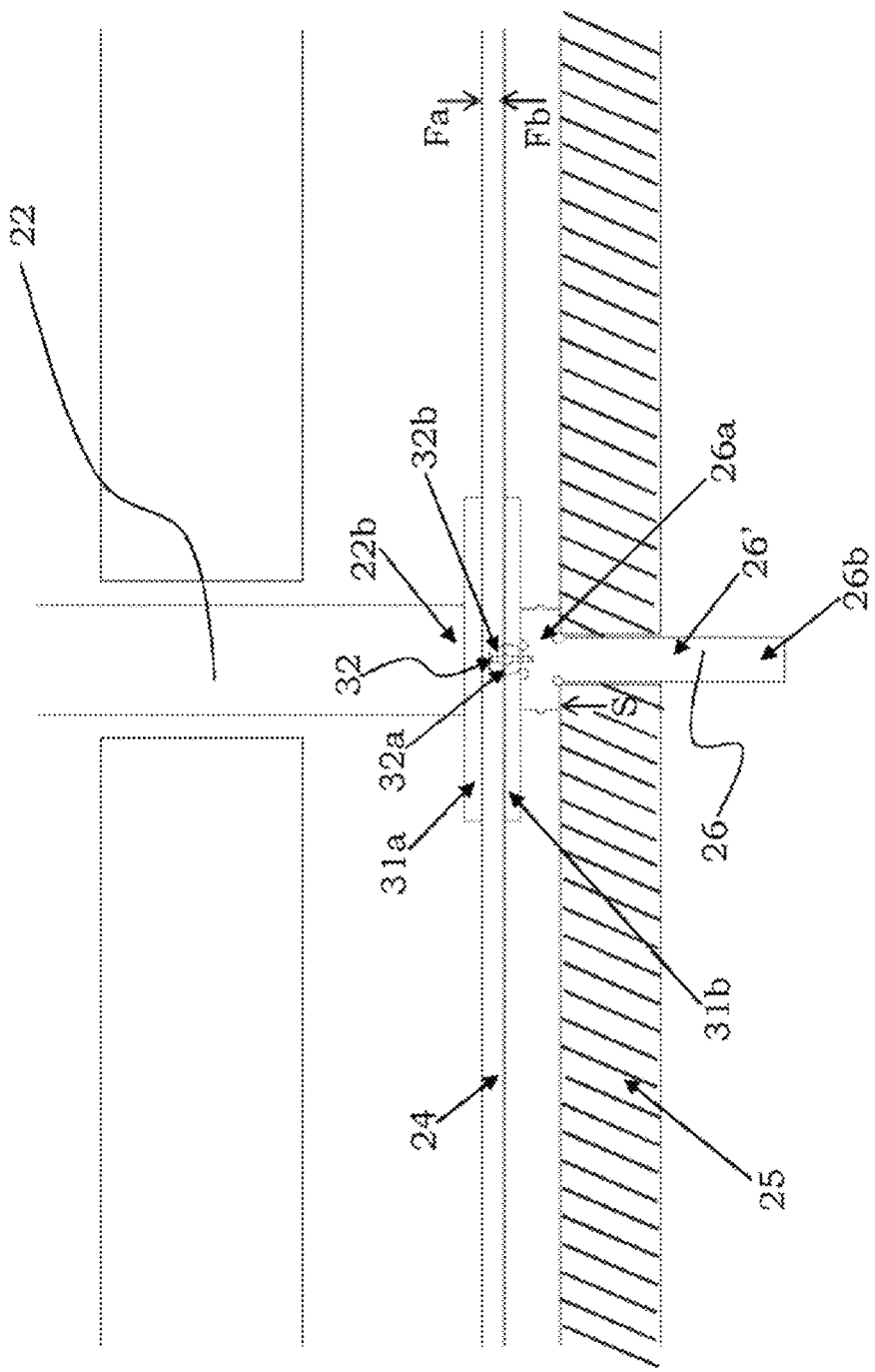
FIG. 4 schematically shows a detail of the probe card according to the present disclosure.

In an embodiment of the present disclosure illustrated in FIG. 4, the flexible membrane 24 comprises a conductive portion 31a at the abutment point of a contact element 22 onto the first face Fa. In combination or alternatively to the conductive portion 31a, the flexible membrane 24 may comprise a conductive portion 31b at the contact point of a micro contact probe 26 with the second face Fb.

The conductive portions 31a and 31b strengthen the flexible membrane 24, in particular they are adapted to deaden the abutment of the second end portion 22b of the contact elements 22 and of the first end portion 26a of the micro contact probes 26 onto the flexible membrane 24, substantially acting as a protective structure thereof, in particular at the contact zone 24a thereof. The conductive portions 31b on the second face Fb further allow the passage of the signals from the micro contact probes 26 to the conductive tracks 29.

As previously noticed, the support 25 acts as a support of the flexible membrane 24 and of the micro contact probes 26. Specifically, the micro contact probes 26 are preferably substantially T-shaped, wherein the first end 26a has a diameter larger than the diameter of the body 26' and of the second end 26b, said first end 26a thus forming the head of the T. In this way, the first end 26a defines a surface S abutting onto the support 25, which in this way acts as a guide and support for the micro contact probes 26.

It is highlighted that herein the term "diameter" always indicates a maximum transversal dimension.

Still referring to FIG. 4, the micro contact probes 26 are connected to the flexible membrane 24 through an engagement element 32 at the first end 26a thereof. The engagement element 32 is configured so as to allow an interlocking connection between the micro contact probes 26 and the flexible membrane 24, in particular thanks to the presence of a first portion 32a and of a second portion 32b projecting from the top of the first end 26a of said micro contact probes 26. Specifically, the first portion 32a is separated from the second portion 32b by a gap or open area, said portions 32a and 32b being adapted to be inserted into an opening of the flexible membrane 24. Once inserted in the opening of the flexible membrane 24, the portions 32a and 32b are pushed one towards the other by the force exerted by the walls of said opening, said portions 32a and 32b thus exerting an opposite force which ensures the desired holding of the micro contact probes 26.

Essentially, the portions 32a and 32b form a sort of elastic fork adapted to fit into the flexible membrane 24.

Obviously, the association between the flexible membrane 24 and the micro contact probes 26 may also occur in other ways, the figures being only provided by way of non-limiting example of the present disclosure.

In the embodiments illustrated in FIG. 2 and FIG. 4, the contact elements 22 are not adapted to carry signals, but are only included as damping elements of the probe card 20, so as to overcome the problem caused by the rigidity of the micro contact probes 26 and to avoid the breakage thereof during the contact with the contact pads 28 of the device under test.

Figure 5:
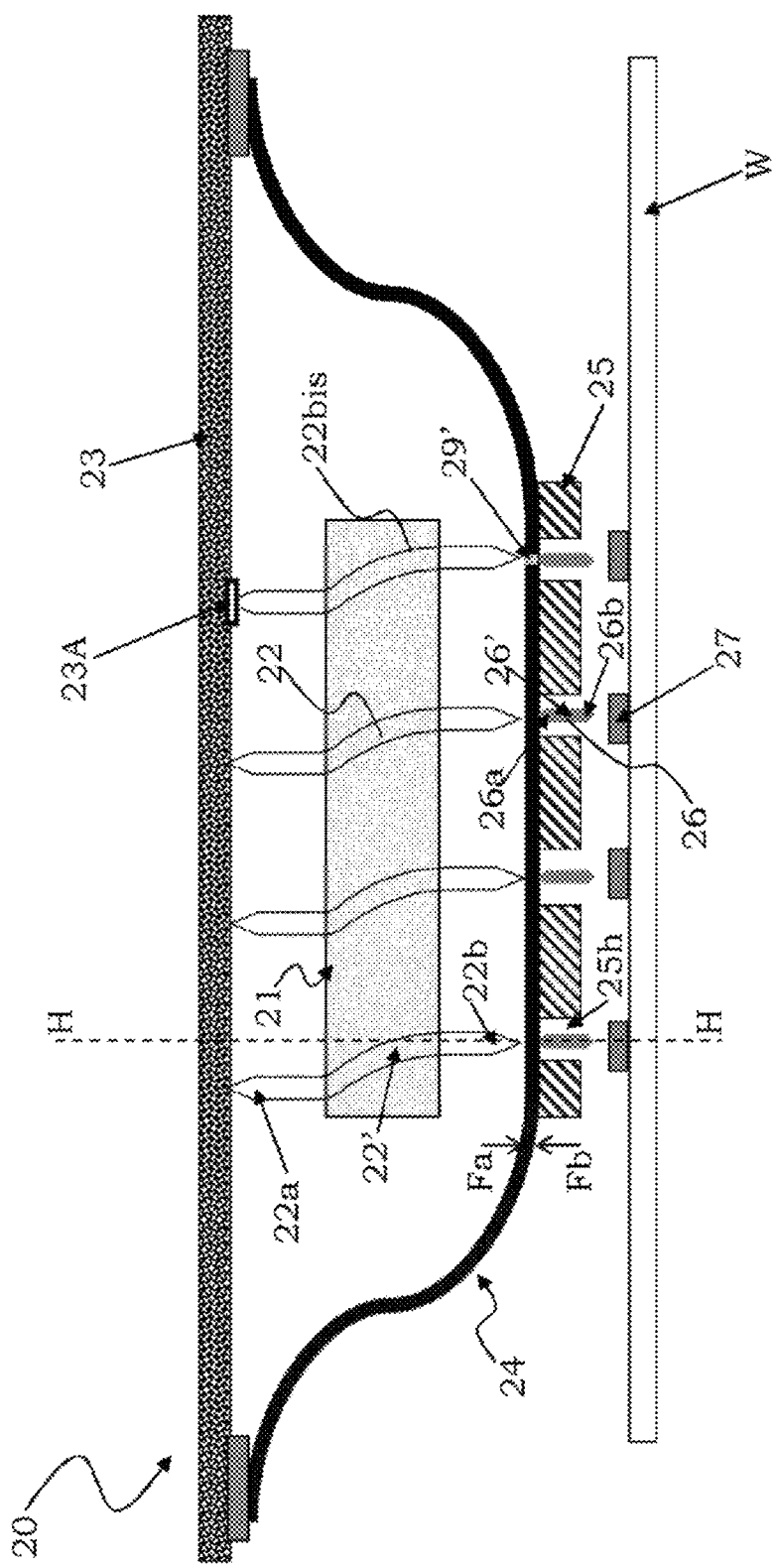
FIG. 5 schematically shows a probe card according to an embodiment of the present disclosure.

Alternatively, in an embodiment of the present disclosure illustrated in FIG. 5, also a group 22bis of the contact elements 22 is adapted to carry signals between the device under test and the test equipment. Each contact element of said group 22bis is thus electrically connected to a corresponding micro contact probe 26 by means of connection conductive tracks 29' in the flexible membrane 24, said connection conductive tracks 29' extending between the first face Fa and the second face Fb of said flexible membrane 24. In other words, the connection conductive tracks 29' are adapted to connect the opposite faces Fa and Fb of the flexible membrane 24, said connection conductive tracks 29' being formed for instance by filling suitable further through-holes or through-paths made in said flexible membrane 24 with a conductive material. In case the conductive portions 31a and 31b are present, the connection conductive tracks 29' connect said conductive portions.

The contact elements of the group 22bis thus perform a dual function, namely on the one hand they act as damping elements of the probe card 20, in particular of the micro contact probes 26, and on the other hand they carry signals towards the support plate 23. In this embodiment, the contact elements not included in the group 22bis are electrically insulated from the micro contact probes 26 and also from the other contact elements, only maintaining the function of damping elements. Moreover, there is to say that the contact elements of the group 22bis are adapted to carry power signals and/or ground signals and/or low frequency signals between the device under test and the support plate 23.

In this embodiment, the support plate 23 comprises conductive contact pads 23A at the first end portion of the contact elements of the group 22bis, onto which said end portions abut for actually carrying the signals towards the test equipment.

As previously mentioned, the connection conductive tracks 29' may connect the conductive portion 31a of the first face Fa and the conductive portion 31b of the second face Fb, or it is possible to make only one conductive pad that passes through the flexible membrane 24 and emerges on said faces Fa and Fb.

Figure 6:
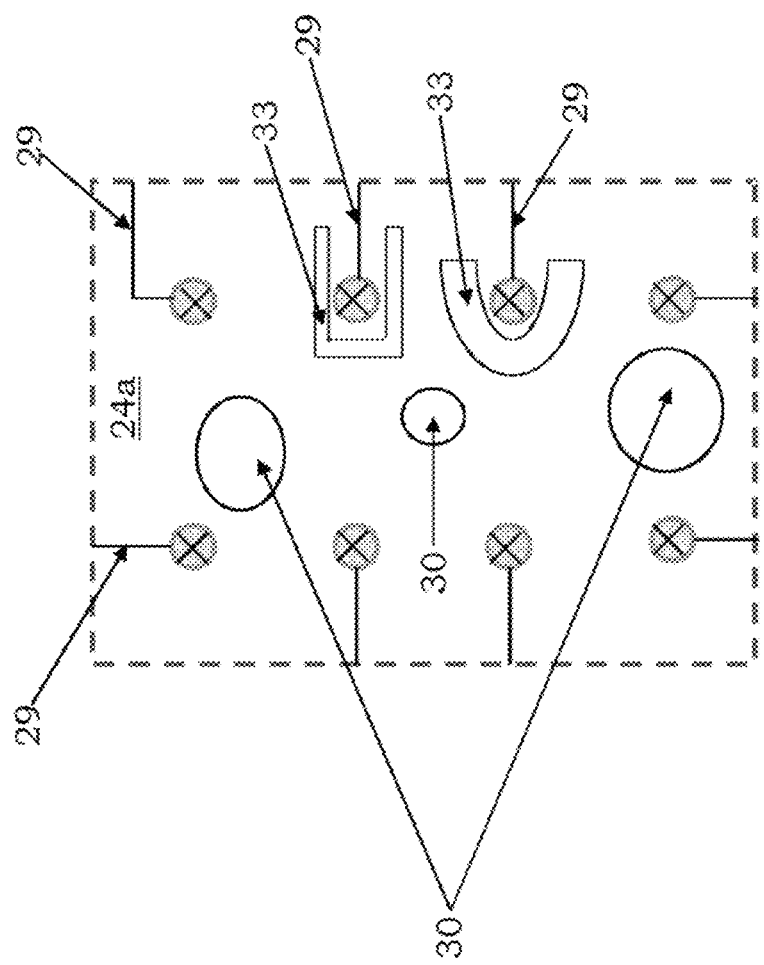
FIG. 6 schematically shows a detail of the flexible membrane of a probe card according to an embodiment of the present disclosure.

Furthermore, in an embodiment of the present disclosure illustrated in FIG. 6, the contact zone 24a comprises through-holes 30 between the first face Fa and the second face Fb, each of said through-holes 30 being passed through by at least one contact element of the testing head 21, said contact element passing through said through-hole 30 being adapted to directly contact the contact pads 27 of the device under test. Like the contact elements of the group 22bis, also the contact elements passing through the through-holes 30 are adapted to carry power signals, ground signals or low frequency signals.

The through-holes 30 may be dimensioned so as to be passed through by only one contact element or may be dimensioned so as to be passed through by several contact elements. It is noted that the number, arrangement and dimension of the through-holes 30 may vary according to the requirements and/or needs. Obviously, in this embodiment, also the support 25 comprises corresponding through-holes in order to allow the passage of the contact elements.

Still referring to FIG. 6, the central zone 24a of the flexible membrane 24 comprises at least one further weakening element 33 close to one or more micro contact probes 26 in contact therewith. These further weakening elements 33 (made for instance by laser removal) may be in the form of cuts or non-through slots.

Furthermore, the further weakening elements 33 preferably extend on three sides of the contact point (or of a possible conductive portion 31b) of the micro contact probes 26 with the flexible membrane 24, said further weakening elements 33 may have any suitable shape, for instance they may be horseshoe- or semicircle-shaped, as indicated in FIG. 6. Still more preferably, the further weakening elements 33 have two sides extending longitudinally beyond the contact point (or beyond a possible conductive portion 31b) by a length generally between 400 µm and 600 µm (preferably of 500 µm) and run substantially parallel to the conductive track 29 extending from said contact point. In other words, a side of the further weakening elements 33 has dimensions substantially equal to those of the conductive portion 31b whereas the other sides have a greater dimension and extend by about other 500 µm following the conductive tracks 29.

The presence of the further weakening elements 33 allows solving possible planarity problems of the probe card 20 since they allow a corresponding movement between the micro contact probes 26.

It is further noted that, although FIG. 6 shows an embodiment in which both the through-holes 30 and the further weakening elements 33 are present, it is possible to provide for embodiments in which only the through-holes 30 or only the further weakening elements 33 are present.

The micro contact probes 26, which are adapted to contact the contact pads 27 of the device under test that is integrated on the semiconductor wafer W, are made of a conductive material or by a suitable alloy.

The flexible membrane 24 is made by dielectric materials, preferably polyamide, able to provide the desired flexibility and the desired electric insulation, whereas the conductive tracks 29 are made of a conductive metallic material, for example copper.

The width of the tracks and the thickness of the flexible membrane 24 are chosen so as to obtain a desired impedance control and to minimize the attenuation of the transmission signal. The signal transmission in the membrane may be compared to a transmission in a coaxial cable. In this case, on one of the two faces of the flexible membrane the conductive tracks adapted to carry radiofrequency signals run, whereas on the opposite face the ground tracks run, which follow the path of the conductive tracks adapted to carry radiofrequency signals on the other face.

The support plate 23 has a configuration analogous to that of the prior art PCB boards, with the difference that the contact pads thereof are preferably made on a peripheral portion thereof, so that the same may electrically contact the conductive tracks 29 (or possible pads of the membrane) at the peripheral zone 24b of the flexible membrane 24.

Furthermore, the support 25 is preferably made of a ceramic material.

Finally, it is noted that in an embodiment of the present disclosure not illustrated in the figures, the testing head 21 comprises at least one guide, provided with a plurality of guide holes within which the contact elements 22 are slidingly housed.

In conclusion, the present disclosure provides a probe card wherein the contact with a device under test is performed by probes of reduced dimensions or micro probes connected to a contact zone of a flexible membrane, which comprises, in a zone thereof adjacent to the contact zone, mechanical weakening elements which facilitate the local deformation of said adjacent zone and reduce the stresses which the flexible membrane is subjected to during the contact with the device under test.

The proposed probe card is particularly performing in radiofrequency applications, thanks to the reduced dimensions of the micro contact probes comprised therein, having a length less than that of the contact elements and in particular less than 500 µm.

The presence of the contact elements of the testing head arranged between the flexible membrane and the PCB, which substantially operate as damping elements for the micro contact probes (namely they are adapted to dampen the contact between the micro contact probes and the contact pads of a device under test thanks to their greater bending capacity) allows obviating the rigidity of said micro contact probes having a reduced length, thus drastically reducing the possibility of breakage of the micro-probes themselves and at the same time ensuring a proper reduction in the pressure exerted thereby, thus avoiding any breakage of the contact pads of the devices under test onto which the micro probes abut.

Advantageously according to the present disclosure, the presence of the weakening elements of the flexible membrane (preferably in the form of a plurality of cuts) makes the weakening zone particularly deformable since it reduces the mechanical resistance thereof. In this way, it is possible to reduce the tensile stresses which the flexible membrane is subjected to during the contact with the device under test.

In particular, it is precisely the presence of the weakening elements of the weakening zone that allows the contact central zone of the flexible membrane to raise under the thrust of the micro contact probes without excessive stresses for the membrane itself, since said weakening zone tends to absorb much easier the stresses caused by the contact with the device under test. In fact, the weakening zone's greater capacity to deform, due to the weakening elements, makes the remaining portions of the flexible membrane subjected to a considerably less stress and thus contributes to increase the performances of the probe card of the present disclosure.

The contact elements of the testing head further act as pre-load elements of the micro contact probes, ensuring that said micro probes are always correctly associated with the flexible membrane, which further advantageously realizes the desired routing of the signals inside the probe card.

Furthermore, the possibility of a hybrid configuration, in which some of the contact elements of the testing head are adapted to carry signals, greatly simplifies the signal routing by the flexible membrane, which in this way is only adapted to the high frequency signal routing. As a result, in case the contact zone of the flexible membrane comprises a plurality of micro contact probes matrices (each matrix being adapted to contact a respective device on the wafer), it is possible to route the conductive tracks exiting from each matrix towards the PCB just passing through one or two sides of said matrix, making the parallel test of a plurality of electronic devices possible, namely by aligning the micro probe matrices by the sides which the conductive tracks do not pass through.

Suitably, the probe card according to the present disclosure is able to perform the so-called full array test of devices that are integrated on a semiconductor wafer, the configuration of the flexible membrane making any arrangement of the micro contact probes in the contact zone thereof possible. In this way, it is possible to provide any arrangement of micro contact probes matrices in the contact zone, no constraint being present in said zone.

Furthermore, advantageously according to the present disclosure, the flexible membrane, the contact elements and the micro contact probes are structurally independent from each another, since the flexible membrane is not fixedly associated (for instance welded) with the contact elements, the latter only abutting thereonto, said flexible membrane and said micro contact probes being supported by the ceramic support of the probe card. All this ensures an increased repairability of the probe card in its whole, since the single components thereof may be easily replaced.

Finally, the possible presence of the further weakening elements in the contact zone of the membrane allows solving any planarity problems of the probe card. Possible local misalignments are compensated by the presence of said further weakening elements.

From the foregoing it will be appreciated that, although specific embodiments of the disclosure have been described herein for purposes of illustration, various modifications may be made without deviating from the spirit and scope of the disclosure, all included in the protection scope as defined by the appended claims.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A probe card for a test equipment of electronic devices, comprising:
   a support plate;
   a flexible membrane configured to carry high frequency signals between a device under test and the support plate, the flexible membrane being connected to the support plate through a peripheral zone thereof;
   a damping structure arranged between the support plate and the flexible membrane, the damping structure being configured to damp an abutment onto the device under test; and
   a plurality of micro contact probes comprising a body extending between a first end and a second end, said second end being configured to abut onto contact pads of the device under test,
   wherein the damping structure and the first ends of the micro contact probes are in contact with opposite first and second faces of a same contact zone of the flexible membrane,
   wherein the flexible membrane includes at least one weakening zone arranged between the contact zone and the peripheral zone and adjacent thereto, the weakening zone comprising at least one weakening element configured to mechanically weaken the flexible membrane and to locally increase the deformability of the flexible membrane, and
   wherein the weakening element is in the form of a plurality of cuts, or in the form of at least one non-through slot of the flexible membrane in the weakening zone.

2. The probe card according to claim 1, wherein the cuts extend substantially parallel to one another along a longitudinal axis of the flexible membrane.

3. The probe card according to claim 1, wherein the extension of the cuts along the longitudinal axis is between 1 mm and 4 mm.

4. The probe card according to claim 1, wherein the flexible membrane comprises two weakening zones which are symmetrically arranged with respect to the contact zone.

5. The probe card according to claim 1, wherein the contact zone comprises at least one further weakening element arranged at at least one micro contact probe.

6. The probe card according to claim 1, comprising at least one support including a plurality of guide holes configured to house the micro contact probes, said support being configured to support the micro contact probes and the flexible membrane.

7. The probe card according to claim 6, wherein the micro contact probes are T-shaped, and wherein the first end thereof has a diameter larger than the diameter of the body so as to define a surface abutting onto the support.

8. The probe card according to claim 1, wherein the micro contact probes are connected to the flexible membrane by means of an engagement element at the first end thereof, the engagement element being configured so as to allow an interlocking connection between the micro contact probes and the flexible membrane, and wherein the engagement element comprises a first portion and a second portion projecting from the top of the first end and separated by a space, said first and second portions being adapted to be inserted into an opening of the flexible membrane and to be moved one towards the other by the walls of said opening.

9. The probe card according to claim 1, wherein the support plate is a printed circuit board.

10. The probe card according to claim 1, wherein the flexible membrane comprises a plurality of conductive tracks extending from the contact zone towards the support plate passing through the weakening zone.

11. The probe card according to claim 1, wherein the damping structure is a testing head housing a plurality of contact elements extending between a first end and a second end.

12. The probe card according to claim 11, wherein the second end of each contact element of the testing head abuts onto the same point which is in contact with the first end of a respective micro contact probe.

13. The probe card according to claim 11, wherein the contact elements of the testing head comprise a group of contact elements configured to carry power signals, ground signals, or low frequency signals between the device under test and the support plate, said contact elements of said group being electrically connected to the micro contact probes.

14. The probe card according to claim 11, wherein the contact zone comprises through holes between the first face and the second face for the passage of at least one contact element configured to carry power signals, ground signals, or low frequency signals between the device under test and the support plate.

15. The probe card according to claim 11, wherein the flexible membrane comprises a conductive portion arranged at an abutment point of the contact elements onto the first face, or arranged at a contact point of the micro contact probes with the second face.

16. A probe card for a test equipment of electronic devices, comprising:
   a printed circuit board;
   a flexible membrane configured to carry high frequency signals between a device under test and the printed circuit board, the flexible membrane being connected to the printed circuit board through a peripheral zone thereof;
   a damping structure arranged between the printed circuit board and the flexible membrane, the damping structure being configured to damp an abutment onto the device under test; and
   a plurality of micro contact probes comprising a body extending between a first end and a second end, said second end being configured to abut onto contact pads of the device under test,
   wherein the damping structure and the first ends of the micro contact probes are in contact with opposite first and second faces of a same contact zone of the flexible membrane,
   wherein the flexible membrane includes at least one weakening zone arranged between the contact zone and the peripheral zone and adjacent thereto, the weakening zone comprising at least one weakening element configured to mechanically weaken the flexible membrane and to locally increase the deformability of the flexible membrane,
   wherein the damping structure is a testing head housing a plurality of contact elements extending between a first end and a second end, and
   wherein the weakening element is in the form of a plurality of cuts, or in the form of at least one non-through slot of the flexible membrane in the weakening zone, and wherein the cuts extend substantially parallel to one another along a longitudinal axis of the flexible membrane.

17. The probe card according to claim 16, wherein the second end of each contact element of the testing head abuts onto a same point which is in contact with the first end of a respective micro contact probe.

18. The probe card according to claim 16, wherein the contact zone comprises through holes between the first face and the second face for the passage of at least one contact element configured to carry power signals, ground signals, or low frequency signals between the device under test and the printed circuit board.

19. The probe card according to claim 16, comprising at least one support including a plurality of guide holes configured to house the micro contact probes, said support being configured to support the micro contact probes and the flexible membrane, and wherein the micro contact probes are T-shaped, and wherein the first end thereof has a diameter larger than the diameter of the body so as to define a surface abutting onto the support.

\* \* \* \* \*